United States Patent
Jo et al.

(10) Patent No.: US 8,618,540 B2
(45) Date of Patent: Dec. 31, 2013

(54) SEMICONDUCTOR PACKAGES

(75) Inventors: Jun-Ho Jo, Hwaseong-si (KR);
Byoung-Sul Kim, Suwon-si (KR);
Kwang-Won Park, Suwon-si (KR);
Hak-Yong Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 167 days.

(21) Appl. No.: 13/118,948

(22) Filed: May 31, 2011

(65) Prior Publication Data

US 2011/0297933 A1 Dec. 8, 2011

(30) Foreign Application Priority Data

Jun. 8, 2010 (KR) ........................ 10-2010-0053989

(51) Int. Cl.
*H01L 23/58* (2006.01)

(52) U.S. Cl.
USPC ....................................... 257/48; 257/E23.01

(58) Field of Classification Search
USPC ............... 257/48, E23.01, E23.012, E23.141, 257/E23.146, E23.151, E23.169, E23.175, 257/734, 773, 784, 786; 438/14, 17, 18, 438/FOR. 101, FOR. 104
See application file for complete search history.

(56) References Cited

U.S. PATENT DOCUMENTS

| | | | | |
|---|---|---|---|---|
| 6,198,635 B1 * | 3/2001 | Shenoy et al. | ................. | 361/760 |
| 6,459,161 B1 * | 10/2002 | Hirata et al. | ................... | 257/786 |
| 6,512,289 B1 * | 1/2003 | Elward | ........................... | 257/691 |
| 6,812,565 B2 * | 11/2004 | Nishimoto et al. | ........... | 257/723 |
| 7,745,915 B2 * | 6/2010 | Suwa et al. | .................... | 257/678 |
| 8,076,787 B2 * | 12/2011 | Hayashi | ........................ | 257/786 |
| 8,114,687 B2 * | 2/2012 | Mizoguchi | ....................... | 438/17 |
| 2004/0017008 A1 * | 1/2004 | Ueda | .............................. | 257/734 |
| 2006/0279315 A1 * | 12/2006 | Takagi et al. | .................. | 324/765 |
| 2007/0070672 A1 * | 3/2007 | Hur | ................................. | 365/53 |
| 2007/0152350 A1 * | 7/2007 | Kim et al. | ...................... | 257/786 |
| 2009/0065773 A1 * | 3/2009 | Ishikawa et al. | ................ | 257/48 |
| 2009/0101896 A1 * | 4/2009 | Shinagawa | ....................... | 257/48 |
| 2010/0009473 A1 * | 1/2010 | Mizoguchi | ....................... | 438/17 |

FOREIGN PATENT DOCUMENTS

| | | |
|---|---|---|
| JP | 2003249558 A | 9/2003 |
| KR | 20020045641 A | 6/2002 |
| KR | 100804148 | 4/2007 |

* cited by examiner

*Primary Examiner* — Fernando L Toledo
*Assistant Examiner* — Victoria K Hall
(74) *Attorney, Agent, or Firm* — Harness, Dickey & Pierce, P.L.C.

(57) ABSTRACT

Provided are a semiconductor package, a semiconductor memory module including the semiconductor package, and a system including the semiconductor memory module. The semiconductor package may include a plurality of main terminals arranged on a surface of the semiconductor package with constant intervals, and the plurality of main terminals may include terminals of a first set including a plurality of input/output terminals to which test signals may be input, and terminals of a second set including a plurality of input/output terminals to/from which signals other than the test signals may be input/output.

23 Claims, 8 Drawing Sheets

SEMICONDUCTOR PACKAGES

CROSS-REFERENCE TO RELATED APPLICATIONS

This application claims priority under 35 U.S.C. §119 to Korean Patent Application No. 10-2010-0053989, filed on Jun. 8, 2010, in the Korean Intellectual Property Office, the entire contents of which are herein incorporated herein by reference.

BACKGROUND

1. Field

Example embodiments relate to a semiconductor package with improved security, which does not require a customizing of a test equipment, a semiconductor memory module, and a system.

2. Description of the Related Art

Some conventional semiconductor packages include external connection terminals for testing that is provided for convenience to manufacturers. Currently, semiconductor packages have a lot of room for improvement in terms of security of information and simplification of a test equipment.

SUMMARY

Example embodiments provide a semiconductor package that has improved security and does not require a customizing operation of test equipment.

Example embodiments also provide a semiconductor memory module including the semiconductor package.

Example embodiments also provide a system including the semiconductor memory module.

In accordance with example embodiments, a semiconductor package may include a plurality of main terminals on a surface of the semiconductor package. In example embodiments, the plurality of main terminals may be arranged with constant intervals. In example embodiments the plurality of main terminals may include terminals of a first set including a plurality of input/output terminals to which test signals may be input, and terminals of a second set including a plurality of input/output terminals to/from which signals other than the test signals may be input/output.

In accordance with example embodiments, a semiconductor package may include a plurality of main terminals arranged in a pattern having one of a square and rectangular circumference. The plurality of main terminals may include terminals of a first set and the terminals of the first set may be configured to receive test signals.

In accordance with example embodiments, a semiconductor package may include a plurality of main terminals arranged on a substrate. In example embodiments, the plurality of main terminals may include a first set of terminals configured to receive test signals, a second set of terminals configured to receive signals other than test signals, and a plurality of dummy terminals. In example embodiments, a spacing between the terminals of the first set, a spacing between the terminals of the second set, and a spacing between the dummy terminals of the plurality of dummy terminals may be substantially the same.

According to example embodiments, a semiconductor package may include a plurality of main terminals arranged on a surface of the semiconductor package with constant intervals. In example embodiments, the plurality of main terminals may include terminals of a first set including a plurality of input/output terminals to which test signals may be input and terminals of a second set including a plurality of input/output terminals to/from which signals other than the test signals may be input/output.

The plurality of main terminals may include one or more dummy terminals. The plurality of main terminals may be arranged to have a circumference formed as a rectangle or a square. The plurality of main terminals may be arranged as a grid along with four sides of the rectangle or the square. The semiconductor package may further include a blank region, in which the main terminals are not arranged, in the rectangle or the square.

The semiconductor package may be formed as a rectangle or a square, and four sides of the rectangular or square extension of the plurality of main terminals may be respectively in parallel with four sides of the semiconductor package.

The terminals of the first set may be arranged adjacent to each other in a region of the rectangle or the square.

The semiconductor package may turn on or turn off a test mode by inputting predetermined signals to the terminals of the first set.

According to example embodiments, a semiconductor package may include a plurality of main terminals that are arranged to have a circumference formed as a rectangle or a square, wherein the rectangle or the square includes at least some of terminals of a first set, which includes a plurality of input/output terminals to which test signals may be input.

The plurality of main terminals may be arranged adjacent to each other with constant intervals. The plurality of main terminals may include one or more dummy terminals.

The plurality of main terminals may include terminals of a second set including a plurality of input/output terminals to/from which signals other than the test signals may be input/output. Four sides of the rectangular or square circumference of the plurality of main terminals may be respectively in parallel with four sides of the semiconductor package. The semiconductor package may turn on or turn off a test mode by inputting predetermined signals to the terminals of the first set.

All the terminals of the first set may be included in the rectangle or the square.

The semiconductor package may further include a blank region, in which the main terminals are not arranged, in the rectangle or the square. The semiconductor package may further include one or more extra terminals in the blank region. The terminals of the first set may be all included in the main terminals, or at least some of the terminals in the first set may be included in the first extra terminals. The first extra terminals may include at least a terminal of the second set.

The semiconductor package may further include one or more second extra terminals outside the rectangle or the square circumference, wherein the second extra terminals include one or more terminals of the first set.

According to example embodiments, there is provided a semiconductor memory module including the semiconductor package.

According to example embodiments, there is provided a system including the semiconductor memory module.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Example embodiments now will be described more fully hereinafter with reference to the accompanying drawings, in which example embodiments are shown. The inventive concepts may, however, be embodied in many different forms and should not be construed as limited to the example embodiments as set forth herein; rather, example embodiments are provided so that this disclosure will be thorough and complete, and will fully convey the scope of the inventive concepts to those skilled in the art. Like numbers refer to like elements throughout. Thus, the present inventive concepts are not limited by relative sizes and distances illustrated in the accompanying drawings.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing example embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, a plurality of main terminals are arranged at constant intervals on a surface of a semiconductor package, and the plurality of main terminals include terminals of a first set and terminals of a second set. Here, the terminals in the first set may include a plurality of input/output terminals to/from which test signals may be input/output, and the terminals in the second set may include a plurality of input/output terminals to/from which signals other than the test signals may be input/output.

Figure 1:
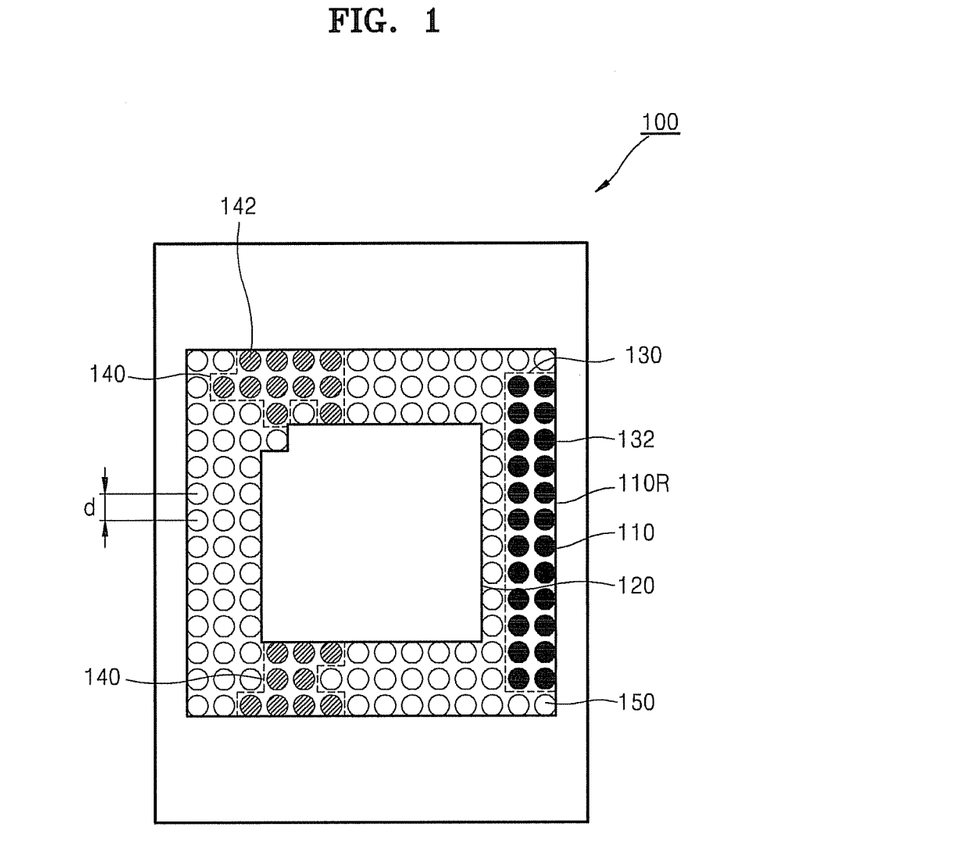
FIGS. 1 through 4 are plan views of a semiconductor package according to example embodiments.

FIG. 1 is a plan view of a semiconductor package 100 according to example embodiments. In example embodiments, main terminals 110 may be arranged on a surface of the semiconductor package 100 at constant intervals d as shown in FIG. 1. Although FIG. 1 shows the spacing d in a vertical direction, the spacing of the main terminals 110 in the horizontal direction may likewise be d. The semiconductor package 100 may be a semiconductor package molded with a molding resin, for example, an epoxy molding compound (EMC), or may be a bare die for fabricating a chip scale package (CSP). Otherwise, the semiconductor package 100 may be a semiconductor die mounted on a printed circuit board.

As shown in FIG. 1, the main terminals 110 may be arranged with substantially constant intervals d. In FIG. 1, the interval d is defined as a distance between centers of two adjacent main terminals 110; however, the interval d may be defined as a pitch between the adjacent terminals or the shortest distance of a conductor, which may cause an electrical short-circuit between two adjacent terminals. In addition, the "substantially" constant interval d means that a difference of the intervals between the main terminals 110 due to tolerance during fabrication can be ignored.

In FIG. 1, the main terminals 110 are illustrated as being circular; however, the main terminals 110 may be formed as ovals or polygons, for example, triangles, rectangles, or pentagons. In addition, shapes and arrangements of the main terminals 110 may be constant in order to define the interval d. In addition, all of the shapes of the main terminals may have substantially the same dimensions. Thus, all of the main terminals 110 may look identical to one another when viewed from outside the semiconductor package 100. Example embodiments, however, are not limited thereto as the shapes of the main terminals 110 may vary from one main terminal to another main terminal.

The main terminals 110 may be pins or pads. If the main terminals 110 are pads, connecting members, for example, solder balls, may be further formed in order to connect the main terminals 110 to external devices. The connecting members are well known to one of ordinary skill in the art, and thus, detailed descriptions about the connecting members are not provided here.

Figure 2:
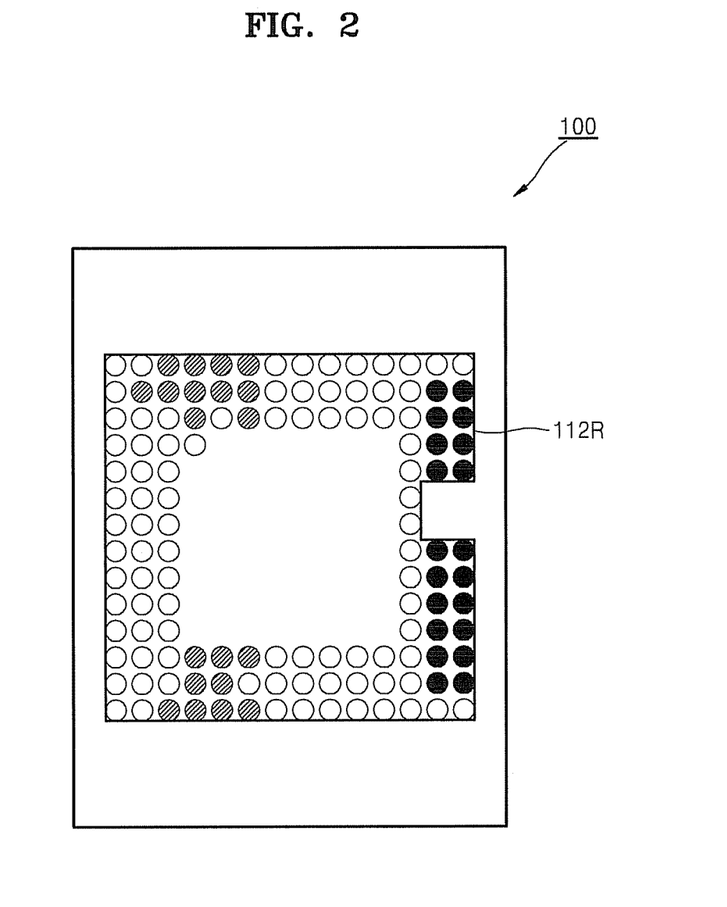

The main terminals 110 may be arranged to have square or rectangular circumference. The circumference of the main terminals 110 may be defined as a figure defined by lines circumscribing two neighboring main terminals 110 among the main terminals 110 located at the outermost portion. As shown in FIG. 1, the circumference of the main terminals 110 may define a main terminal region 110R. Unlike FIG. 1, if some of the main terminals 110 located at the outermost portion are missing, as shown in FIG. 2, a recessed portion may be formed on a circumference 112R of the main terminals 110 and the circumference 112R therefore may not be defined as a square or rectangle.

In FIG. 1, the main terminal region 110R of the main terminals 110 may define a square; however, the main terminal region 110R may be extended to form a rectangle. Here, the rectangle may be defined as a tetragon having four interior angles that are right angles. Therefore, lengths of two sides that are adjacent to each other based on a certain vertex may be different from each other.

The main terminals 110 may include terminals 132 of a first set 130, which consist of a plurality of input/output terminals to which test signals may be input. During the normal operation of the semiconductor package 100, data may not be input/output to/from the terminals 132 in the first set 130. However, data may be input/output to/from the terminals 132 during testing of the semiconductor package 100. In other words, the terminals 132 of the first set 130 may be only used when the semiconductor package 100 is tested.

In order to test the semiconductor package 100, a test probe (not shown) of a test equipment is electrically connected to the terminals 132 of the first set 130, and the test probe may be electrically connected to the semiconductor package 100 via the terminals 132 of the first set 130 to perform the test. The test may be a debug test for identifying internal operations of the semiconductor package 100, or may be a dump test for identifying an inner status of the semiconductor package 100. Signals for performing the test may vary depending on a manufacturer, a kind of product, and product specifications, and one of ordinary skill in the art may create a series of test signals themselves. In example embodiments, the signals used for performing the test may or may not be predetermined.

In addition, in order to start the test, signals that may turn on a test mode may be input to the terminals 132 of the first set 130. The signals for turning the test mode on may vary depending on a manufacturer, a kind of product, and product specifications, and one of ordinary skill in the art may create a series of test signals themselves. In example embodiments, the signals used for turning on a test mode may or may not be predetermined.

In addition, in order to end the test, signals that may turn off the test mode may be input to the terminals 132 of the first set 130. The signals for turning the test mode off may vary depending on a manufacturer, a kind of product, and product specifications, and one of ordinary skill in the art may create a series of test signals themselves. In example embodiments, the signals for turning the test mode off may or may not be predetermined.

Figure 4:
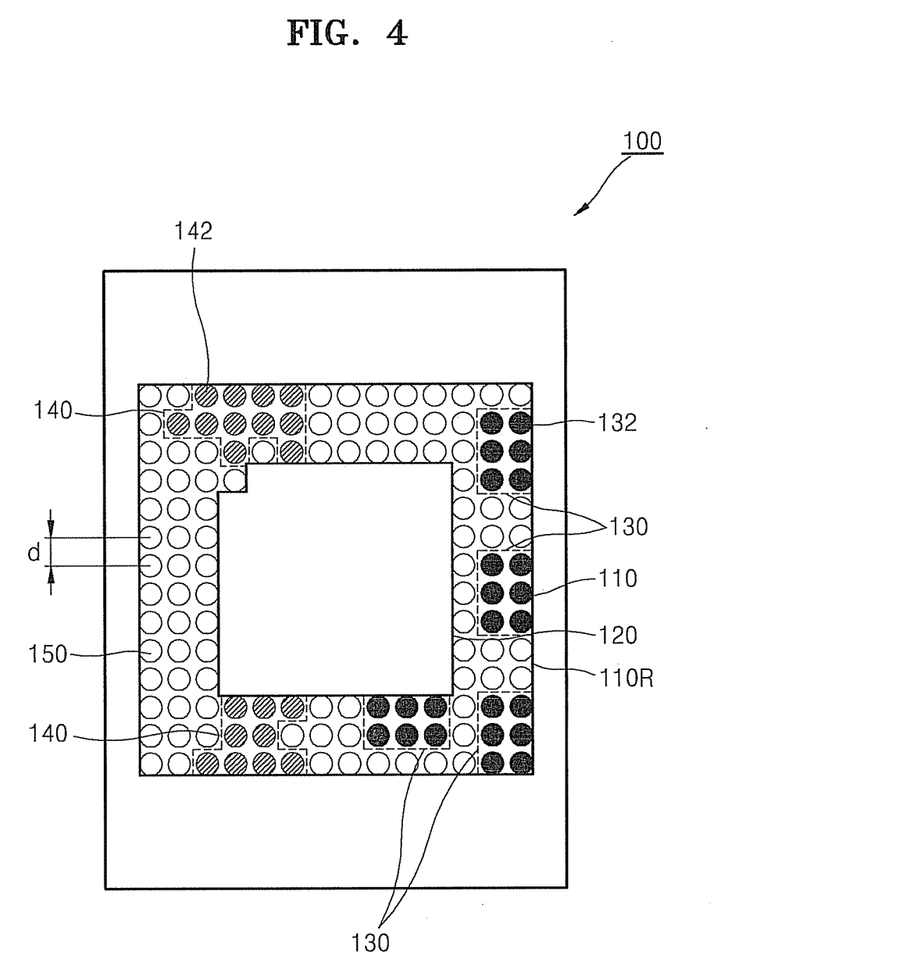

The terminals 132 of the first set 130 may be arranged to be adjacent to each other in one region as shown in FIG. 1, or may be arranged on two or more regions as shown in FIG. 4.

The main terminals 110 may include terminals 142 of a second set 140, which may include a plurality of input/output terminals in which signals other than the test signals may be input. The signals other than the test signals may include signals for normal operation the semiconductor package 100.

In addition, the main terminals 110 may include dummy terminals 150 that are reserved to be irrelevant with the test of the semiconductor package 100 or the normal operation of the semiconductor package 100.

In addition, four sides of the rectangle or the square forming the main terminal region 110R of the main terminals 110 may be respectively parallel with corresponding ones of four sides of the semiconductor package 100.

As shown in FIG. 1, the main terminals 110 may be arranged as a grid along with the four sides of the rectangle or the square forming the circumference of the main terminals 110. The main terminals 110 located at the outermost portion may be arranged along with the four sides of the rectangle or the square with substantially constant intervals, and remaining main terminals 110 may be located at cross points between lines extending in parallel with the four sides of the rectangle or the square. Example embodiments, however, are not limited thereto. For example, the semiconductor package 100 may include a blank region 120, in which the main terminals 110 are not arranged, in the rectangle or the square. The blank region 120 may exist in the rectangle or the square defined by the main terminal region 110R of the main terminals 110, or may not exist.

The blank region 120 does not mean a region having no terminals, but a region in which the main terminals are not arranged. Therefore, extra terminals other than the main terminals 110 may be arranged in the blank region 120.

If the blank region 120 exists, the blank region 120 may be a figure that is defined by lines circumscribing two neighboring terminals among the main terminals 110 that are closest to the blank region 120, in particular, the lines circumscribing the terminals from a side where the main terminals 110 do not exist.

Figure 3:
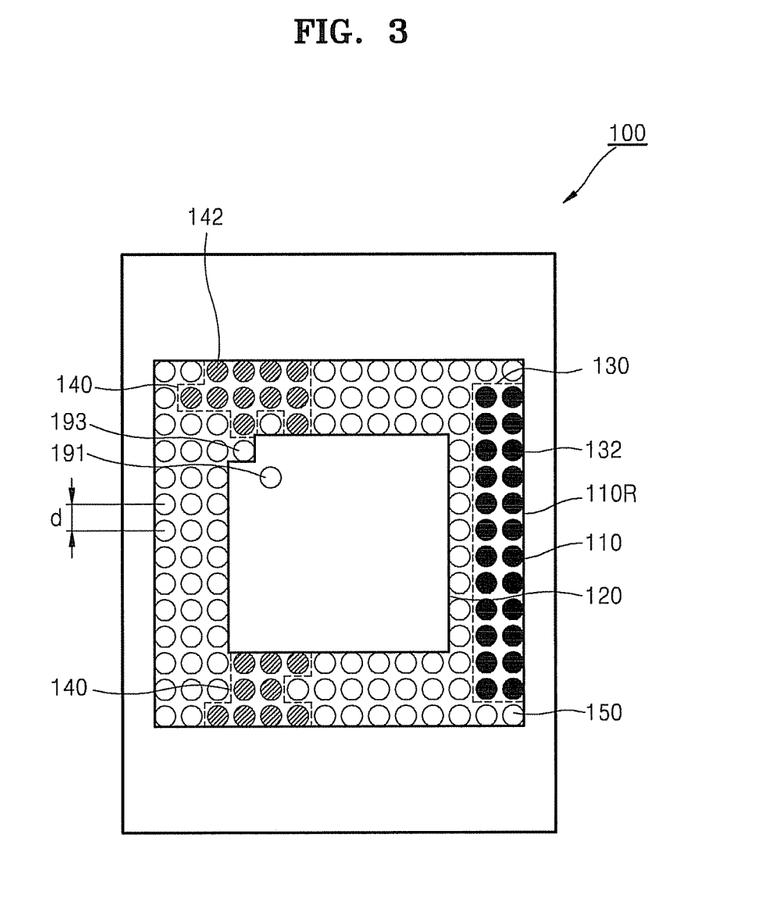

Referring to FIG. 3, a terminal 193 may be considered as a part of the main terminals 110 since the terminal 193 is arranged with the constant interval from adjacent terminals. However, since a terminal 191 is not arranged with the same interval as those of adjacent terminals, the terminal 191 may not be considered as the main terminal 110. Therefore, a region denoted as 120 may be considered as the blank region 120, and the terminal 191 in the blank region 120 may be an extra terminal.

In FIGS. 1 through 4, the blank region 120 is disposed on a center portion of the main terminal region 110R of the main terminals 110; however, the blank region 120 may not be necessarily disposed on the center portion of the main terminal region 110R, but may be biased to a side. However, as described above, the blank region 120 is surrounded by the main terminals 110 in order to be defined as the blank region 120.

According to example embodiments, a semiconductor package, on which a plurality of main terminals are arranged, may have a circumference of the main terminals formed as a rectangle or a square. In particular, the semiconductor package may include terminals of a first set, which may include a plurality of input/output terminals in which test signals for testing the semiconductor package are input, and at least some of the terminals in the first set may be located in the rectangle or the square.

Figure 5:
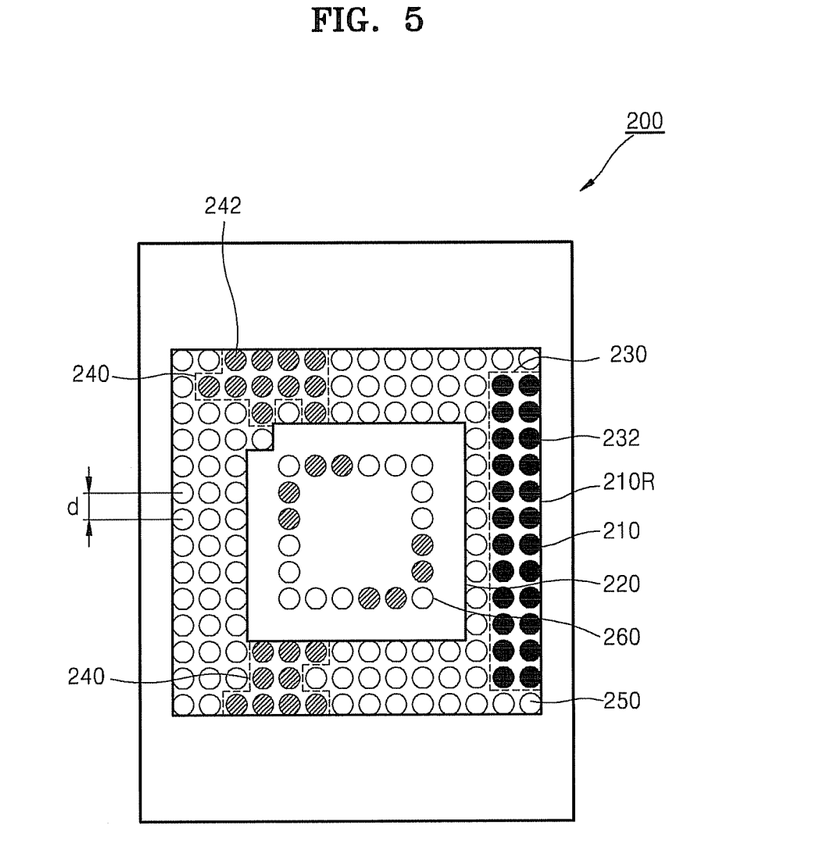
FIGS. 5 and 6 are plan views of a semiconductor package according to example embodiments.

FIG. 5 is a plan view of a semiconductor package 200 according to example embodiments. For the convenience of description, detailed descriptions about the same components as those previously described will not be provided.

In example embodiments, a plurality of main terminals 210 may be arranged on a surface of the semiconductor package 200 as shown in FIG. 5. In example embodiments, the plurality of main terminals 210 may be arranged with constant intervals d. Similar to FIG. 1, a circumference of a main terminal region 210R in which the main terminals 210 are arranged may be formed as a square, but may also be formed as a rectangle.

Similar to FIG. 1, the semiconductor package 200 may include a blank region 220. The definition of the blank region 220 is described previously, and thus, is not provided here.

The blank region 220 may include one or more first extra terminals 260. The first extra terminals 260 may be separated from the main terminals 210 by a distance greater than the interval d. The first extra terminals 260 may be arranged with an interval that is different from the intervals between the main terminals 210, and may be arranged arbitrarily in the blank region 220.

As described previously, terminals 232 in a first set 230 may consist of a plurality of input/output terminals to which test signals are input. The test signals are described previously, and thus, detailed descriptions of the test signals are not provided.

In addition, terminals 242 of a second set 240 may include a plurality of input/output terminals to/from which signals other than the test signals may be input/output. The signals other than the test signals include signals for normal operation of the semiconductor package 200.

The main terminals 210 and the first extra terminals 260 may include the terminals 232 of the first set 230. In addition, the main terminals 210 and the first extra terminals 260 may include the terminals 242 of the second set 240.

Figure 6:
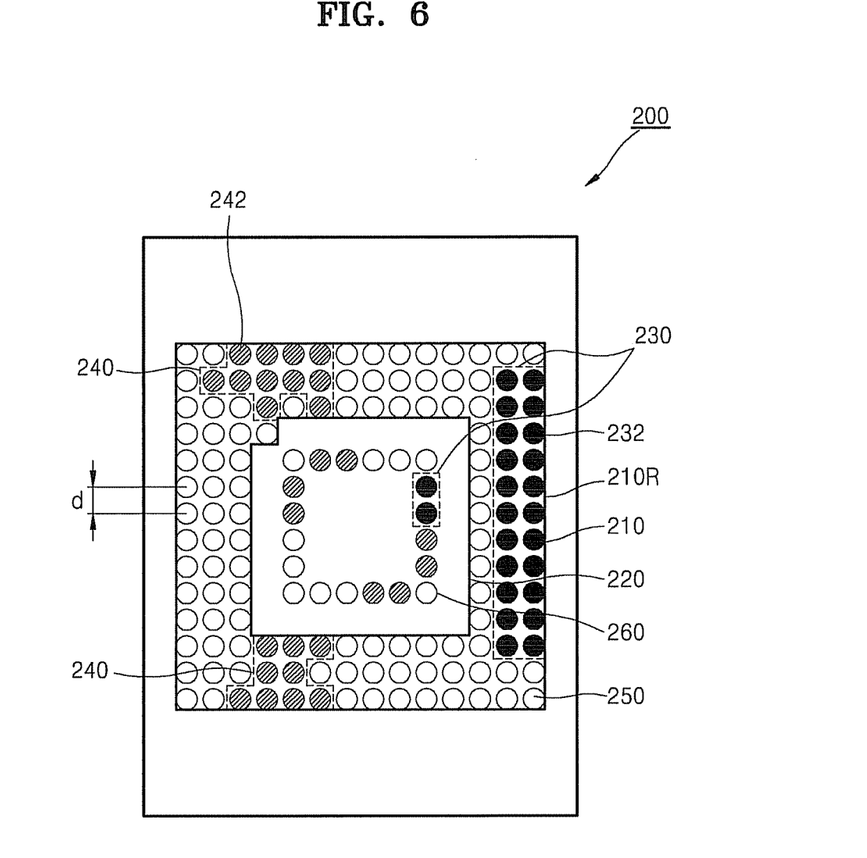

The terminals 232 of the first set 230 may be all included in the main terminals 210; however, at least some of the terminals 232 of the first set 230 may be included in the first extra terminals 260 as shown in FIG. 6. Likewise, the terminals 242 of the second set 240 may be all included in the main terminals 210; however, at least some of the terminals 242 of the second set 240 may be included in the first extra terminals 260. Moreover, all of the terminals 232 in the first set 230 may be included in the first extra terminals 260. In addition, all of the terminals 242 in the second set 240 may be included in the first extra terminals 260.

Also, the main terminals 210 and/or the first extra terminals 260 may include dummy terminals 250. The dummy terminals 250 may be reserved terminals that are irrelevant with the test of the semiconductor package 200 or the normal operation of the semiconductor package 200.

Figure 7:
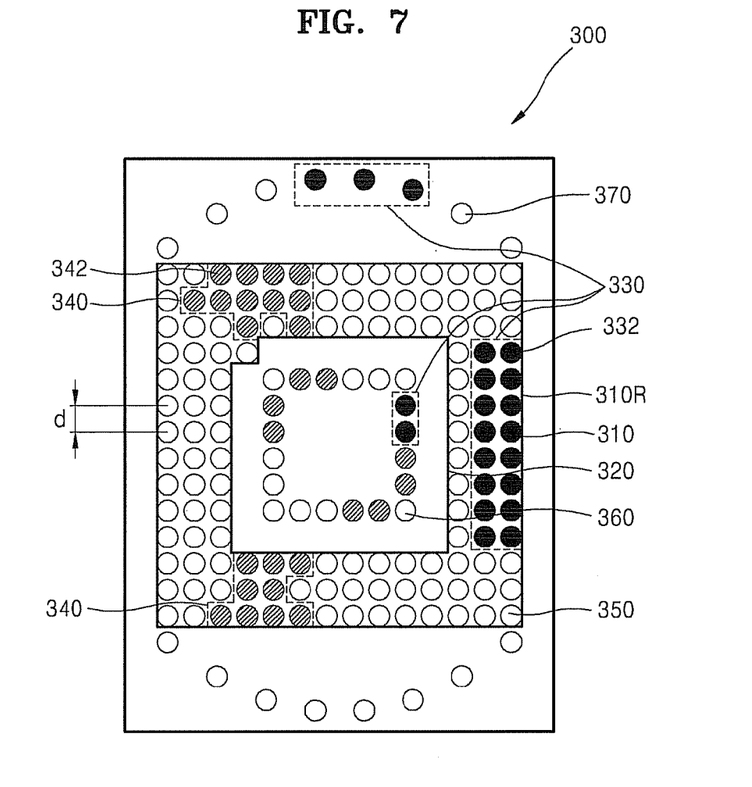
FIG. 7 is a plan view of a semiconductor package according to example embodiments.

A semiconductor package according to example embodiments, as illustrated in FIG. 7, is similar to that of FIG. 6 except that the semiconductor package of FIG. 7 includes second extra terminals. FIG. 7 is a plan view of a semiconductor package 300 according to example embodiments. For the convenience of description, detailed descriptions about the same components as those described previously will not be provided.

In example embodiments, a plurality of main terminals 310 may be arranged on a surface of the semiconductor package 300 with constant intervals d, as illustrated in FIG. 7. A circumference of a main terminal region 310R in which the main terminals 310 are arranged may be a square or a rectangle.

In addition, the semiconductor package 300 may include a blank region 320, and the blank region 320 may include one or more first extra terminals 360. The first extra terminals 360 may be arranged with intervals different from the intervals between the main terminals 310, and may or may not be arranged arbitrarily in the blank region 320.

In addition, the semiconductor package 300 may include one or more second extra terminals 370 on an outer portion of the rectangle or the square. The second extra terminals 370 may be arranged with intervals different from the intervals between the main terminals 310, and may be arbitrarily arranged outside the main terminal region 310R.

Terminals 332 of a first set 330 may consist of a plurality of input and/or output terminals, in which test signals may be input. As described above, the terminals 332 of the first set 330 may be all included in the main terminals 310, or some or all of the terminals 332 in the first set 330 may be included in the first extra terminals 360. In addition, some or all of the terminals 332 in the first set 330 may be included in the second extra terminals 370.

In addition, terminals 342 of a second set 340 may include one or more input/output signals to/from which signals other than the test signals may be input/output. As described above, the terminals 342 of the second set 340 may be all included in the main terminals 310, or some or all of the terminals 342 of the second set 340 may be included in the first extra terminals 360. In addition, some or all of the terminals 342 in the second set 340 may be included in the second extra terminals 370. In example embodiments, the main terminals 310 may also include dummy terminals 350.

Figure 8:
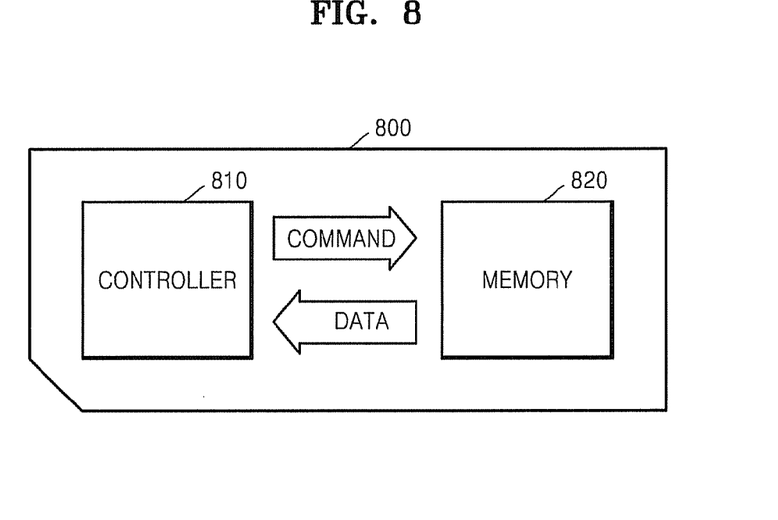
FIG. 8 is a schematic diagram of a semiconductor memory module according to example embodiments.

FIG. 8 is a schematic diagram of a memory module 800 according to example embodiments.

Referring to FIG. 8, a controller 810 and a memory 820 may be disposed to exchange electrical signals with each other. For example, when the controller 810 transmits a command, the memory 820 may transmit data. The memory 820 may include one of the semiconductor packages according to example embodiments as a memory device. The memory device included in the semiconductor packages according to example embodiments may be a volatile or non-volatile memory device as well known in the art, for example, a NAND or NOR memory device. A NAND or NOR memory array including a plurality of columns and rows may form one or more memory array banks (not shown). The memory 820 may include the memory array (not shown) or the memory array bank (not shown). In addition, the memory module 800 may further include a general column decoder (not shown), a row decoder (not shown), input/output (I/O) buffers (not shown), and/or a control register (not shown) in order to drive the memory array bank (not shown). The memory module 800 may include fusion memories such as various kinds of multi-chip packages (MCPs) or embedded multimedia cards (eMMC).

Figure 9:
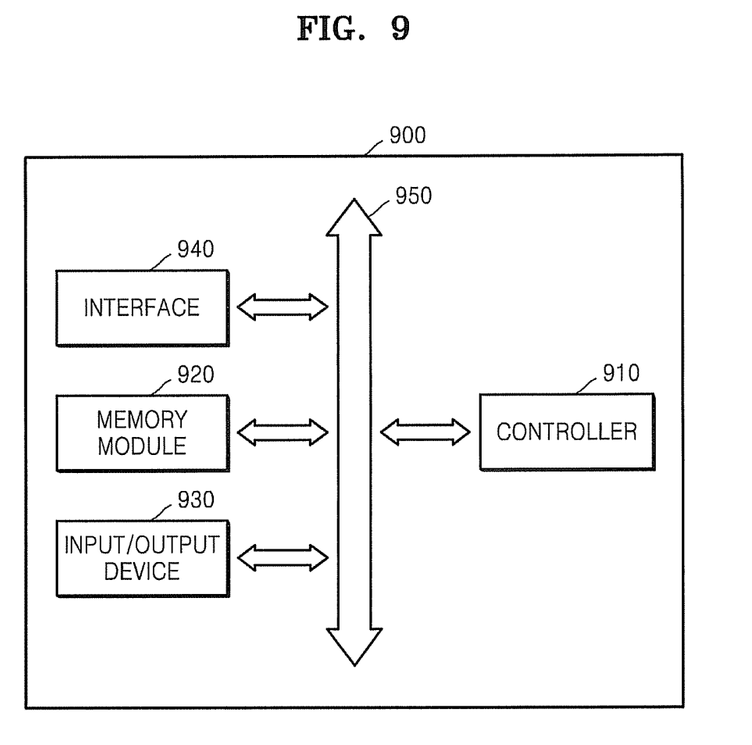
FIG. 9 is a schematic diagram of a system according to example embodiments.

FIG. 9 is a schematic diagram of a system 900 according to example embodiments.

Referring to FIG. 9, the system 900 may include a controller 910, an input/output device 930, a memory module 920, and an interface 940. The system 900 may be, but is not limited to, a mobile system or a system for transmitting or receiving information. The mobile system may be, but is not limited to, a personal digital assistant (PDA), a portable computer, a web tablet, a wireless phone, a mobile phone, a digital music player, or a memory card. In example embodiments, the controller 910 may be configured to execute a program and control the system 900. The controller 910 may be, for example, a microprocessor, a digital signal processor, or a microcontroller. The input/output device 930 may be used to input or output data to/from the system 900. The system 900 may be connected to an external device, for example, a personal computer or a network, to exchange data with the external device by using the input/output device 930. The input/output device 930 may be a keypad, a keyboard, or a display device. The memory module 920 may store codes and/or data for operating the controller 910, and/or may store the data processed by the controller 910. The memory module 920 may include one of the semiconductor packages according to example embodiments. The interface 940 may be a data transmission path between the system 900 and the external device. The controller 910, the input/output device 930, the memory module 920, and the interface 940 may communicate with each other via a bus 950. For example, the system 900 may be used in mobile phones, MP3 players, navigation devices, portable multimedia players (PMP), solid state disks (SSDs), or household appliances.

While example embodiments have been shown and described with reference to the figures, it will be understood by those skilled in the art that various changes in form and details may be made therein without departing from the spirit and scope of the inventive concepts as defined by the appended claims. Example embodiments should be considered in descriptive sense only and not for purposes of limitation. Therefore, the scope of the inventive concepts is defined not by the detailed description of the inventive concepts but by the appended claims, and all differences within the scope will be construed as being included in the present inventive concepts.

What is claimed is:

1. A semiconductor package comprising:
   a plurality of main terminals on a surface of the semiconductor package, wherein the plurality of main terminals includes
   terminals of a first set including a plurality of input/output terminals arranged with a first constant interval in at least a first area and configured to receive test signals, and
   terminals of a second set including a plurality of input/output terminals arranged with the first constant interval in at least a second area and configured to receive or send signals other than the test signals, one or more terminals of the first set and one or more terminals of the second set in a third area different from the first and second areas, the terminals of the first and second sets in the third area having a same appearance and a same interval spacing and separated from the terminals in the first and second areas by a distance greater than the first constant interval.

2. The semiconductor package of claim 1, wherein the plurality of main terminals includes at least one dummy terminal.

3. The semiconductor package of claim 1, wherein the plurality of main terminals are arranged to have one of a square and a rectangular circumference.

4. The semiconductor package of claim 3, wherein the plurality of main terminals are arranged as a grid within the circumference.

5. The semiconductor package of claim 4, wherein the third area is enclosed by the circumference.

6. The semiconductor package of claim 3, wherein
the semiconductor package includes four sides arranged in one of a rectangle or a square, and
the circumference of the plurality of main terminals includes four sides that are substantially parallel with the four sides of the semiconductor package.

7. The semiconductor package of claim 3, wherein the terminals of the first set in the first area are arranged adjacent to each other within the circumference.

8. The semiconductor package of claim 1, wherein the semiconductor package is configured to turn on or turn off a test mode by inputting signals to the terminals of the first set.

9. The semiconductor package of claim 1, wherein at least one terminal of the first set in the third area and at least one adjacent terminal of the second set in the third area are spaced by the first constant interval.

10. A semiconductor package comprising:
a plurality of main terminals arranged in a pattern, the pattern having substantially a square or rectangular circumference, the plurality of main terminals including
terminals of a first set, at least a plurality of the terminals of the first set arranged in a first area and configured to receive test signals, and
terminals of a second set, at least a plurality of the terminals of the second set arranged in a second area and configured to receive signals different from test signals, a first number of the terminals of the first set and a second number of terminals of the second set located in a third area spaced from the first and second areas, the terminals in the third area having a same appearance and a same interval spacing and separated from the terminals in the first and second areas by a distance greater than an interval between the terminals in the first set and an interval between the terminals in the second set.

11. The semiconductor package of claim 10, wherein the plurality of main terminals are arranged adjacent to each other with constant intervals in the first and second areas.

12. The semiconductor package of claim 11, wherein the plurality of main terminals further includes at least one dummy terminal.

13. The semiconductor package of claim 11, wherein four sides of the circumference of the pattern of the plurality of main terminals are parallel with four sides of the semiconductor package.

14. The semiconductor package of claim 11, wherein the semiconductor package is configured to turn on or turn off a test mode by inputting signals to the terminals of the first set.

15. The semiconductor package of claim 11, wherein all the terminals of the first set are enclosed by the circumference.

16. The semiconductor package of claim 10, further comprising: at least one first extra terminal in the third area.

17. The semiconductor package of claim 16, wherein the at least one first extra terminal is configured to receive a test signal.

18. The semiconductor package of claim 16, wherein the at least one first extra terminal is configured to receive a signal other than a test signal.

19. The semiconductor package of claim 11, further comprising:
at least one second extra terminal outside the circumference,
wherein the at least one second extra terminal includes at least one terminal configured to receive a test signal.

20. A semiconductor memory module comprising:
a semiconductor package according to claim 1.

21. A semiconductor memory module comprising:
a semiconductor package according to claim 10.

22. A system comprising: a semiconductor memory module according to claim 20.

23. A system comprising: a semiconductor memory module according to claim 21.

* * * * *